(12) United States Patent
Kajiki et al.

(10) Patent No.: US 8,208,268 B2
(45) Date of Patent: Jun. 26, 2012

(54) SEMICONDUCTOR APPARATUS

(75) Inventors: Atsunori Kajiki, Nagano (JP);
Sadakazu Akaike, Nagano (JP);
Takashi Tsubota, Nagano (JP); Norio Yamanishi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 684 days.

(21) Appl. No.: 12/277,905

(22) Filed: Nov. 25, 2008

(65) Prior Publication Data

US 2009/0135575 A1    May 28, 2009

(30) Foreign Application Priority Data

Nov. 26, 2007  (JP) ................. 2007-304655

(51) Int. Cl.
*H05K 7/00* (2006.01)
(52) U.S. Cl. ........ 361/761; 361/803; 361/790; 361/770; 361/767; 257/776; 257/774
(58) Field of Classification Search ............ 361/761, 361/803, 790, 767, 770; 257/774, 776
See application file for complete search history.

(56) References Cited

U.S. PATENT DOCUMENTS

| | | | |
|---|---|---|---|
| 6,693,362 B2 | 2/2004 | Seyama et al. | |
| 2003/0090883 A1* | 5/2003 | Asahi et al. | 361/761 |

FOREIGN PATENT DOCUMENTS

| | | |
|---|---|---|
| JP | 11-112121 | 4/1999 |
| JP | 11-214819 | 8/1999 |
| JP | 2001-210954 | 8/2001 |
| JP | 2002-076265 | 3/2002 |
| JP | 2002-314031 | 10/2002 |
| JP | 2003-124595 | 4/2003 |
| JP | 2003-347722 | 12/2003 |
| WO | 2007/069606 | 6/2007 |
| WO | WO 2007/110985 A1 | 10/2007 |

\* cited by examiner

*Primary Examiner* — Tuan T Dinh
*Assistant Examiner* — Hung Dang
(74) *Attorney, Agent, or Firm* — Drinker Biddle & Reath LLP

(57) ABSTRACT

A semiconductor apparatus includes: first electronic components; a first circuit board, including first electronic component mounting pads on which the first electronic components are mounted; and a second circuit board located above the first circuit board, wherein the first electronic component mounting pads are arranged on a first face of the first circuit board, opposite the second circuit board, and the first circuit board and the second circuit board are electrically connected by internal connection terminals located between the first circuit board and the second circuit board, and wherein a recessed portion is formed in the second circuit board, opposite the first electronic components, in order to provide space to accommodate portions of the first electronic components.

10 Claims, 6 Drawing Sheets

SEMICONDUCTOR APPARATUS

BACKGROUND OF THE INVENTION

The present invention relates to a semiconductor apparatus, and relates particularly to a semiconductor apparatus wherein electronic components are arranged between two built-up circuit boards.

As one type of conventional semiconductor apparatus, there is a configuration (see FIG. 1) wherein electronic components are arranged between two built-up circuit boards.

FIG. 1 is a cross-sectional view of a conventional semiconductor apparatus.

While referring to FIG. 1, a conventional semiconductor apparatus 400 includes: a first circuit board 401, first electronic components 402 and 403, external connection terminals 404, internal connection terminals 405, a second circuit board 408, a sealing resin 411 and second electronic components 412 and 413.

The first circuit board 401 is a core build-up board, and includes a core board 421 having a plate shape, feedthrough electrodes 422, wires 424 and 438, insulating layers 426 and 439, vias 428 and 441, wiring patterns 431 to 434, internal connection terminal pads 435 and external connection terminal pads 443.

The feedthrough electrodes 422 are formed in and pass through the core board 421 at multiple locations. The wires 424 are laid on an upper face 421A of the core board 421, and are connected to the upper ends of the feedthrough electrodes 422. The insulating layer 426 is then formed on the upper face 421A of the core board 421, covering the wires 424.

The vias 428 are formed in and pass through the portions of the insulating layer 426 that cover the wires 424, to which the lower ends of the vias 428 are connected.

The wiring patterns 431 to 434 are formed on an upper face 426A of the insulating layer 426, and are connected to the upper ends of vias 428. The wiring pattern 431 includes: a first electronic component mounting pad 445, on which the first electronic component 402 is mounted; an internal connection terminal pad 446, on which an internal connection terminal 405 is mounted; and a wire 447, which is integrally formed with the first electronic component mounting pad 445 and the internal connection terminal pad 446 and electrically connects them.

The length (the size) of the internal connection terminal pad 446 is sufficient for the mounting of a connection terminal 405, which has an appropriate diameter that permits the positioning of the first electronic components 402 and 403 between the first circuit board 401 and the second circuit board 408. Relative to this, assuming that the height of each of the first electronic components 403 is 0.33 mm, which is greater than the height of the other first electronic component 402, that the diameter of an internal connection terminal 405 is 0.5 mm and that, in a plan view, the internal connection terminal pad 446 is substantially a circle, the diameter of the internal connection terminal pad 446 can, for example, be 400 µm.

The wiring pattern 432 includes: a first electronic component mounting pad 449, on which the first electronic component 402 is mounted; a first electronic component mounting pad 451, on which the first electronic component 403 is mounted; and a wire 452, which is integrally formed with the first electronic component mounting pads 449 and 451 and electrically connects them.

The wiring pattern 434 includes: a first electronic component mounting pad 457, on which the first electronic component 403 is mounted; an internal connection terminal pad 458, on which an internal connection terminal 405 is arranged; and a wire 459, which is integrally formed with the first electronic component mounting pad 457 and the internal connection terminal pad 458 and electrically connects them.

The length (the size) of the internal connection terminal pad 458 is sufficient for the mounting of a connection terminal 405, which has an appropriate diameter that permits the positioning of the first electronic components 402 and 403 between the first circuit board 401 and the second circuit board 408. Thus, assuming that the height of each of the first electronic components 403 is 0.33 mm, which is greater than the height of the other first electronic component 402, that the diameter of an internal connection terminal 405 is 0.5 mm and that, in a plan view the internal connection terminal pad 458 is substantially a circle, the diameter of the internal connection terminal pad 458 can, for example, be 400 µm.

The internal connection terminal pads 435 are arranged on the upper face 426A of the insulating layer 426, and are connected to the upper ends of vias 428. The length (the size) of the internal connection terminal pad 435 is sufficient for the mounting of a connection terminal 405, which has an appropriate diameter that permits the positioning of the first electronic components 402 and 403 between the first circuit board 401 and the second circuit board 408. Relative to this, assuming that each of the first electronic components 403, which are taller than the other first electronic component 402, has a height of 0.33 mm, that 0.5 mm is the diameter of the internal connection terminals 405, and that in a plan view the internal connection terminal pads 435 are substantially circles, the internal connection terminal pads 435 can, for example, have diameters of 400 µm.

The wires 438 are provided on the lower face 421B of the core board 421, and are connected to the lower ends of the feedthrough electrodes 422. The insulating layer 439 is formed on the lower face 421B of the core board 421 and covers the wires 438.

The vias 441 are formed in and pass through the portions of the insulating layer 439 that cover the wires 438, and their upper ends are connected to the wires 438. The external connection pads 443 are formed on a lower face 439A of the insulating layer 439, and are connected to the lower ends of the vias 441.

The first electronic component 402 is mounted on the first electronic component mounting pads 445 and 449. And as the first electronic component 402, a semiconductor chip can, for example, be employed.

The first electronic components 403 are mounted on the first electronic component mounting pads 451, 454, 455 and 457, and are electrically connected to the first electronic component 402 via the wiring patterns 432 and 433. Chip capacitors, chip resistors or chip inductors, for example, can be employed as the first electronic components 403, and the external connection terminals 404 are mounted on the external connection pads 443.

The internal connection terminals 405 are mounted on the internal connection terminal pads 435. The internal connection terminals 405 are employed to electrically connect the first circuit board 401 to the second circuit board 408, which is built-up on the first circuit board 401, and also to provide a gap between the first circuit board 401 and the second circuit board 408, so that the first electronic components 402 and 403, mounted on the first circuit board 401, can be accommodated within the gap. Assuming that the first electronic components 403, which are taller than the other first electronic component 402, have a height of 0.33 mm, the diameter of the internal connection terminals 405 can, for example, be 0.5 mm.

The second circuit board 408 is a core build-up board, and includes: a core board 463, having a plate shape, feedthrough electrodes 464, wires 466 and 481, insulating layers 467 and 483, vias 469 and 484, a second electronic component mounting pad 472, wiring patterns 473 to 476 and internal connection terminal pads 485.

The feedthrough electrodes 464 are formed in and pass through the core board 463 at multiple locations. The wires 466 are extended along an upper face 463A of the core board 463, and are connected to the upper ends of the feedthrough electrodes 464. The insulating layer 467 is formed on the upper face 463A of the core board 463, covering the wires 466.

The vias 469 are located so they pass through the portions of the insulating layer 467 on which the wring 466 is laid, and the lower ends of the vias 469 are connected to the wires 466. The second electronic component mounting pad 472 is mounted on an upper face 467A of the insulating layer 467, and is connected to the upper end of the via 469 and the second electronic component 413.

The wiring patterns 473 to 476 are formed on the upper face 467A of the insulating layer 467, and are connected to the upper ends of the vias 469. The wiring pattern 473 includes: second electronic component mounting pads 491 and 492, on which the second electronic components 413 are mounted; and a wire 493, which is integrally formed with the second electronic component mounting pads 491 and 492 and electrically connects them.

The wiring pattern 474 includes a second electronic component mounting pad 495, on which the second electronic component 413 is mounted; a second electronic component mounting pad 496, on which the second electronic component 412 is mounted; and a wire 497, which is integrally formed with the second electronic component mounting pads 495 and 496 and electrically connects them.

The wiring pattern 475 includes: a second electronic pad mounting pad 501, on which the second electronic component 412 is mounted; a second electronic component mounting pad 502, on which the second electronic component 413 is mounted; and a wire 503, which is integrally formed with the second electronic component mounting pads 501 and 502 and electrically connects them.

The wiring pattern 476 includes: a second electronic component mounting pad 505, on which the second electronic component 413 is mounted; and a wire 506, which is integrally formed with the second electronic component mounting pad 505 and is connected to the via 469.

The wires 481 are provided at multiple locations on the lower face 463B of the core board 463, and are connected to the lower ends of the feedthrough electrodes 464. The insulating layer 483 is deposited on the lower face 463B of the core board 463 and covers the wires 481. The vias 484 are formed in and pass through the portions of the insulating layer 483 located below the wires 481, and their upper ends are connected to the wires 481.

The internal connection terminal pads 485 are located on the lower face 483A of the insulating layer 483 and are connected to the internal connection terminals 405, which are connected to the first circuit board 401. With this arrangement, the second circuit board 408 is electrically connected to the first circuit board 401 via the internal connection terminals 405. The internal connection terminal pads 485 have a length (a size) large enough for the mounting of the internal connection terminals 405, which have an appropriate diameter within which the first electronic components 402 and 403 can be mounted on the first circuit board 401 and accommodated between the first and second circuit boards 401 and 408.

In reference to this, assuming that each of the first electronic components 403, which are taller than the other first electronic component 402, has a height of 0.33 mm, and the diameter of the internal connection terminal 405 is 0.5 mm and the shape of the internal connection terminal pads 485, in a plan view, is substantially a circle, the diameter of the internal connection terminal pads 485 can, for example, be 400 μm (for the above description, see, for example, patent document 1).

[Patent Document 1] WO 2007/069606

According to the conventional semiconductor apparatus 400, the diameter of the internal connection terminals 405, for electrically connecting the first circuit board 401 and the second circuit board 408, is increased, so that space between the first and second circuit boards 401 and 408 can be obtained into which the first electronic components 402 and 403, which are mounted on the first circuit board 401, can be fitted. As a result, the height of the semiconductor apparatus 400 is increased, and can not be reduced.

Further, when the diameters of the internal connection terminals 405 are increased, accordingly, the internal connection terminal pads 435, 446, 458 and 485, to which the internal connection terminals 405 are connected, must consequently be enlarged (their dimensions increased) in the plane direction. As a result, the sizes of the first circuit board 401 and the second circuit board 408 enlarge in the plane direction and therefore the semiconductor apparatus 400 can not be downsized longitudinally.

As one method to be used for reducing the size of the semiconductor apparatus 400, electronic components having low heights (0.2 mm or less) can be mounted on the first circuit board 401 as the first electronic components 402 and 403. However, the lineup of presently available electronic components includes only a few, expensive ones that have satisfactory heights, and under prevailing circumstances, employing such electronic components for the semiconductor apparatus 400 is not feasible.

SUMMARY OF THE INVENTION

While taking the above problems into account, one objective of the preset invention is to provide a semiconductor apparatus that can be downsized by reducing the height and the length, as measured along the upper surface plane.

According to a first aspect of the present invention, there is provided a semiconductor apparatus including:

first electronic components, a first circuit board including first electronic component mounting pads on which the first electronic components are mounted, and a second circuit board located above the first circuit board, wherein the first electronic component mounting pads are arranged on a first face of the first circuit board, opposite the second circuit board, the first circuit board and the second circuit board are electrically connected by internal connection terminals located therebetween, and a recessed portion is formed in the second circuit board opposite the first electronic components to accommodate portions of the first electronic components.

According to a second aspect of the invention, there is provided the semiconductor apparatus according to the first aspect, wherein the first electronic components are mounted on the first circuit board at multiple locations, and the recessed portion is formed in a portion of the second circuit board, opposite part of the first electronic components mounted on the first circuit board, which is higher than a height of the internal connection terminals located between the first circuit board and the second circuit board.

According to a third aspect of the invention, there is provided the semiconductor apparatus according to the first or second aspect, further including:

a sealing resin provided to seal a space between the first circuit board and the second circuit board.

According to a forth aspect of the invention, there is provided the semiconductor apparatus according to any one of the first to third aspects, wherein a feedthrough portion is formed in the second circuit board and passes through a portion of the second circuit board that corresponds to a bottom of the recessed portion.

According to a fifth aspect of the invention, there is provided the semiconductor apparatus according to any one of the first to forth aspects, wherein second electronic component mounting pads are arranged on a face of the second circuit board, opposite a face where the recessed portion is formed, and a second electronic component is mounted on the second electronic mounting pad.

According to a sixth aspect of the invention, there is provided the semiconductor apparatus according to any one of the first to fifth aspects, wherein the internal connection terminal is a conductive ball including:

a core for maintaining a predetermined distance between the first circuit board and the second circuit board, and a coat portion that covers the core.

According to a seventh aspect of the invention, there is provided the semiconductor apparatus according to any one of the first to sixth aspects, further including:

external connection pads which are arranged on a second face of the first circuit board opposite the first face and are electrically connected to the second circuit board.

According to this invention, since a recessed portion provided to accommodate portions of the first electronic components is formed in the second circuit board, opposite the first electronic components mounted on the first circuit board, the distance between the first circuit board and the second circuit board can be reduced, compared with the conventional arrangement. Thus, the height of the semiconductor apparatus can be reduced.

Furthermore, since the distance has been shortened from the first circuit board to the second circuit board, between which the internal connection terminals are located, the diameters of the internal connection terminals can be reduced until smaller than those of conventional internal connection terminals, and the sizes of the pads provided on the first and second circuit boards, for the attachment of the internal connection terminals, can also be reduced (their dimensions can be decreased) across the planes of their surfaces. Thus, the lengths of the first and second circuit boards can be shortened and the semiconductor apparatus can be downsized longitudinally.

According to an eighth aspect of the invention, there is provided a semiconductor apparatus including:

first electronic components, a first circuit board including first electronic component mounting pads on which the first electronic components are mounted, and a second circuit board, located below the first circuit board, that faces the first electronic components mounted on the first circuit board, wherein the first circuit board and the second circuit board are electrically connected by internal connection terminals located therebetween, and an electronic component accommodating feedthrough portion, for accommodating portions of the first electronic components, is formed in the second circuit board and passes through a portion of the second circuit board that faces the first electronic components.

According to a ninth aspect of the invention, there is provided the semiconductor apparatus according to the eighth aspect, wherein the first electronic components are mounted at multiple locations, and the electronic component accommodating feedthrough portion is formed in a portion of the second circuit board, opposite part of the first electronic components mounted on the first circuit board, that rises above lower ends of the internal connection terminals connected to the first circuit board.

According to a tenth aspect of the invention, there is provided the semiconductor apparatus according to the eighth or ninth aspect, further including:

a sealing resin provided to seal a space between the first circuit board and the second circuit board.

According to an eleventh aspect of the invention, there is provided the semiconductor apparatus according to any one of the eighth to tenth aspects, wherein second electronic component mounting pads are arranged on a face of the first circuit board, opposite a face where the first electronic component mounting pads are formed, and a second electronic component is mounted on the second electronic mounting pad.

According to a twelfth aspect of the invention, there is provided the semiconductor apparatus according to any one of the eighth to eleventh aspects, wherein the internal connection terminal is a conductive ball including:

a core for maintaining a predetermined distance between the first circuit board and the second circuit board, and a coat portion that covers the core.

According to the invention, the electronic component accommodating feedthrough portion is formed in the second circuit board and passes through the portion of the second circuit board that faces the first electronic components, which are mounted on the first electronic circuit board, and is employed for accommodating portions of the first electronic components. Therefore, the distance between the first and second circuit boards, between which the internal connection terminals are arranged, can be reduced, and therefore, the height of the semiconductor apparatus can be reduced.

Furthermore, since the distance has been shortened from the first circuit board to the second circuit board, between which the internal connection terminals are located, the diameters of the internal connection terminals can be reduced until smaller than those of conventional internal connection terminals, and the sizes of the pads provided on the first and second circuit boards, for the attachment of the internal connection terminals, can also be reduced (their dimensions can be decreased) across the planes of their surfaces. Thus, the lengths of the first and second circuit boards can be shortened and the semiconductor apparatus can be downsized longitudinally.

According to the present invention, the semiconductor apparatus can be downsized by reducing the height and the length, measured along the plane of the upper surface.

DETAILED DESCRIPTION OF THE PREFERRED EMBODIMENTS

The embodiments of the present invention will now be described while referring to drawings.

(First Embodiment)

Figure 2:
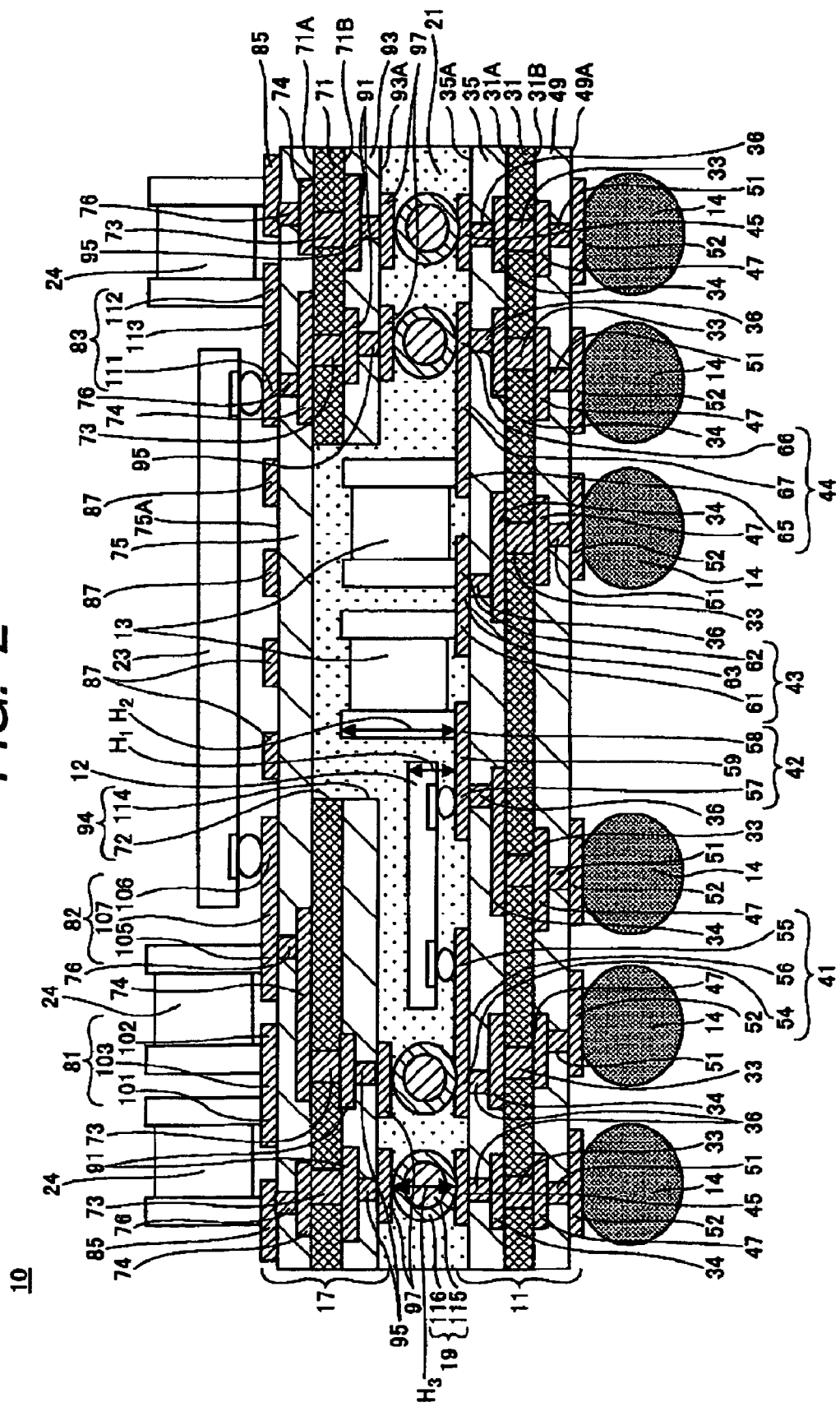
FIG. 2 is a cross-sectional view of a semiconductor apparatus according to a first embodiment of the present invention.

FIG. 2 is a cross-sectional view of a semiconductor apparatus according to a first embodiment of the present invention.

Referring to FIG. 2, a semiconductor apparatus 10 of the first embodiment includes: a first circuit board 11, first electronic components 12 and 13, external connection terminals 14, a second circuit board 17, internal connection terminals 19, a sealing resin 21 and second electronic components 23 and 24.

The first circuit board 11 is a core build-up board, and includes: a core board 31, feedthrough electrodes 33, wires 34 and 47, insulating layers 35 and 49, vias 36 and 51, wiring patterns 41 to 44, internal connection terminal pads 45 and external connection pads 52.

The core board 31 is plate shaped, and can be a resin layer, formed by impregnating glass fiber with a resin.

The feedthrough electrodes 33 are formed in and pass through the core board 31 at multiple locations, and can be formed using Cu, for example, and by plating.

The wires 34 are laid on an upper face 31A of the core board 31, and are connected to the upper ends of the feedthrough electrodes 33. The wires 34 can be formed using Cu, for example, and by employing the subtractive method.

The insulating layer 35, which is deposited on the upper face 31A of the core board 31 to cover the wires 34, can be a resin layer formed, for example, of an epoxy resin or a polyimide resin.

The vias 36 are formed in and pass through the portions of the insulating layer 35 covering the wires 34, and their lower ends are connected to the wires 34. The vias 36 can be formed using Cu, for example, and by employing the semi-additive method, at the same time as the wiring patterns 41 to 44 and the internal connection terminal pads 45 are formed.

The wiring pattern 41 is formed on a portion of an upper face 35A of the insulating layer 35 that corresponds to the peripheral portion of the first circuit board 11, and is connected to the upper end of a via 36. The wiring pattern 41 includes: an internal connection terminal pad 54, to which the internal connection terminal 19 is connected; a first electronic component mounting pad 55, on which the first electronic component 12 is mounted; and a wire 56, which electrically connects the internal connection terminal pad 54 to the first electronic component mounting pad 55.

Figure 1:
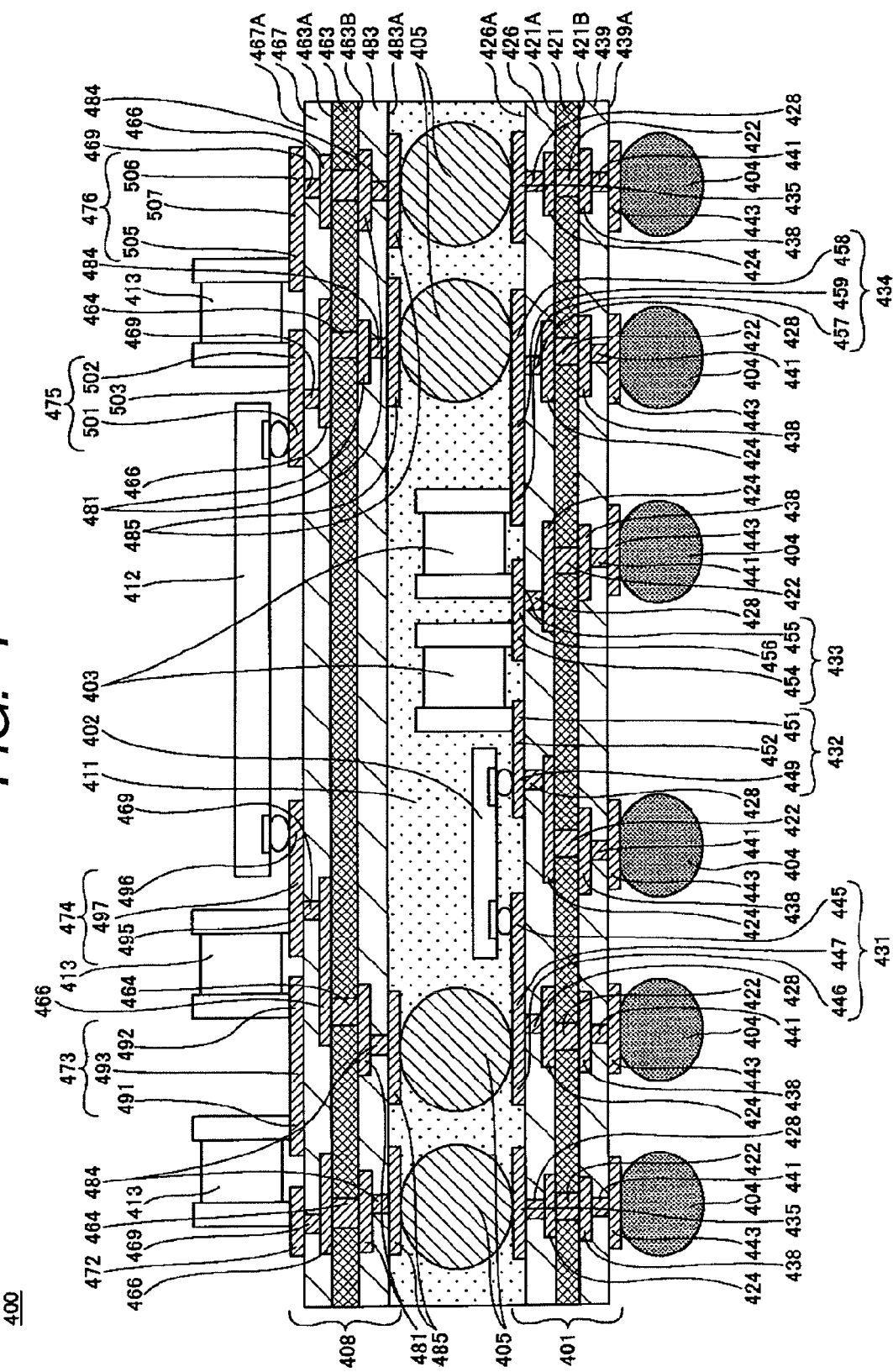
FIG. 1 is a cross-sectional view of a conventional semiconductor apparatus.

The internal connection terminal pad 54 is formed so it is smaller across the plane of its surface (i.e., is smaller dimensionally) than the internal connection terminal pads 435, 446, 458 and 485 (see FIG. 1) that are provided for the conventional semiconductor apparatus 400. When the diameter of an internal connection terminal 19 is 0.26 mm and the shape of the internal connection terminal pad 54 is substantially a circle in plan view, the diameter of the internal connection terminal pad 54 can, for example, be 200 µm.

The wiring pattern 42 is formed on the portion of the upper face 35A of the insulating layer 35 that corresponds to the center of the first circuit board 11, and is connected to the upper end of a via 36. The wiring pattern 42 includes: a first electronic component mounting pad 57, on which the first electronic component 12 is mounted; a first electronic component mounting pad 58, on which the first electronic component 13 is mounted; and a wire 59, which electrically connects the first electronic component mounting pads 57 and 58.

The wiring pattern 43 is formed on the portion of the upper face 35A of the insulating layer 35 that corresponds to the center portion of the first circuit board 11, and is connected to the upper end of a via 36. The wiring pattern 43 includes: first electronic component mounting pads 61 and 62, on which first electronic components 13 are mounted; and a wire 63, which electrically connects the first electronic component mounting pads 61 and 62.

The wiring pattern 44 is formed on the portion of the upper face 35A of the insulating layer 35 that corresponds to the peripheral portion of the first circuit board 11, and is connected to the upper end of a via 36. The wiring pattern 44 includes: a first electronic component mounting pad 65, on which the first electronic component 13 is mounted; an internal connection terminal pad 66, to which the internal connection terminal 19 is connected; and a wire 67, which electrically connects the first electronic component mounting pad 65 to the internal connection terminal pad 66.

The internal connection terminal pad 66 is formed so it is smaller (i.e., is smaller dimensionally) across the plane of its surface than are the internal connection terminal pads 435, 446, 458 and 485 (see FIG. 1) that are provided for the conventional semiconductor apparatus 400. When the diameter of the internal connection terminal 19 is 0.26 mm and the shape of the internal connection terminal pad 66 is substantially a circle in plan view, the diameter of the internal connection terminal pad 66 can, for example, be 200 µm.

The vias 36 and the wiring patterns 41 to 44 can be formed at the same time using Cu, for example, and by employing the semi-additive method.

The internal connection terminal pads 45 are formed on the portion of the upper face 35A of the insulating layer 35 (the first face of the first circuit board 11) that corresponds to the peripheral portion of the first circuit board 11. When the internal connection terminals 19 are mounted on the internal connection terminal pads 45, the internal connection terminal pads 45 can be electrically connected, via the internal connection terminals 19, to internal connection terminal pads 97 provided for the second circuit board 17, which will be described later. The internal connection terminal pads 45 are formed so they are smaller (i.e., are dimensionally smaller) across the plane of their surfaces than are the internal connection terminal pads 435, 446, 458 and 485 (see FIG. 1) that are provided for the conventional semiconductor apparatus 400. When the diameter of the internal connection terminal 19 is 0.26 mm and the shape of the internal connection terminal pad 45 is substantially a circle in plan view, the diameter of the internal connection terminal pad 45 can, for example, be 200 µm.

The internal connection terminal pads 45 can be formed using Cu, for example, and by employing the semi-additive method, at the same time as the vias 36 are formed.

The wires 47 are formed on a lower face 31B of the core board 31, and are connected to the lower ends of the feedthrough electrodes 33. The wires 47 can be formed using Cu, for example, and by employing the subtractive method.

The insulating layer 49 is formed on the lower face 31B of the core board 31 to cover the wires 47. The insulating layer 49 can be a resin layer formed, for example, of an epoxy resin or a polyimide resin.

The vias 51 are formed in and pass through the portions of the insulating layer 49 below the wires 47, and their upper ends are connected to the wires 47. The vias 51 can be formed using Cu, for example, and by employing the semi-additive method, at the same time as the external connection pads 52 are formed.

The external connection pads 52 are formed on a lower face 49A of the insulating layer 49 (the second face of the first circuit board 11), and are electrically connected to the first electronic components 12 and 13, which are mounted on the first circuit board 11.

Since the external connection pads 52 are mounted on the lower face 49A of the insulating layer 49, the semiconductor apparatus 10 can be electrically connected to a mounting board (not shown), such as a motherboard, via the external connection terminals 14.

The external connection pads 52 can be formed using Cu, for example, and by employing the semi-additive method, at the same time as the vias 51 are formed.

The first electronic component 12 is mounted on the first electronic component mounting pads 55 and 57, and is electrically connected to the internal connection terminal 19 via the wiring pattern 41. A height $H_1$ of the first electronic component 12 is smaller than a height $H_3$ of the internal connection terminals 19 that are located between the first circuit board 11 and the second circuit board 17. A semiconductor chip can be employed as an example first electronic component 12. When a semiconductor chip is employed as the first electronic component 12, the height $H_1$ of the first electronic component 12 mounted on the first electronic component mounting pads 55 and 57 can, for example, be 0.1 mm.

The first electronic components 13 are mounted on the first electronic component mounting pads 58, 61, 62 and 65, and are electrically connected to the first electronic component 12 via the wiring pattern 42. A height $H_2$ of the first electronic components 13 is greater than the height $H_3$ of the internal connection terminals 19 that are located between the first circuit board 11 and the second circuit board 17. The first electronic components 13 can, for example, be chip capacitors, chip resistors or chip inductors. When chip capacitors, chip resistors or chip inductors are employed as the first electronic components 13, the height $H_2$ of the first electronic components 13 mounted on the first electronic component mounting pads 58, 61, 62 and 65 can, for example, be 0.33 mm.

The external connection terminals 14 are arranged on the external connection pads 52 to electrically connect a mounting board (not shown), such as a motherboard, to the semiconductor apparatus 10. Solder balls can be employed for the external connection terminals 14, and the formation of the external connection terminals 14 is performed after the second electronic components 23 and 24 have been mounted on the second circuit board 17, i.e., at the end of the processing. It should be noted that the external connection terminals 14 may be formed first, and thereafter, the second electronic components 23 and 24 may be mounted.

The second circuit board 17 is a core build-up board, and is located above the first circuit board 11. The second circuit board 17 is electrically connected to the first circuit board 11 via the internal connection terminals 19, which are arranged between the first circuit board 11 and the second circuit board 17.

The second circuit board 17 includes: a core board 71, feedthrough electrodes 73, wires 74 and 91, insulating layers 75 and 93, vias 76 and 95, wiring patterns 81 to 83 and 87, second electronic component mounting pads 85, a recessed portion 94 and internal connection terminal pads 97.

The core board 71 is a plate shaped board, and has a first feedthrough portion 72 that passes through the portion of the core board 71 corresponding to the area in which the recessed portion 94 is formed. Thus, the first feedthrough portion 72 is one of the components used to define the form of the recessed portion 94. The core board 71 can be a resin layer, formed, for example, by impregnating glass fiber with a resin.

The feedthrough electrodes 73 are formed in and pass through the core board 71 at multiple locations. The feedthrough electrodes 73 can be formed using Cu, for example, and by plating.

The wires 74 are extended across an upper face 71A of the core board 71, and are connected to the upper ends of the feedthrough electrodes 73. The wires 74 can be formed by using Cu, for example, and by employing the subtractive method.

The insulating layer 75 is deposited on the upper face 71A of the core board 71 to cover the feedthrough electrodes 73 and the wires 74. As described above, since the insulating layer 75 is deposited on the upper face 71A of the core board 71 to cover the first feedthrough portion 72 provided for the core board 71, the planarization of an upper face 75A of the insulating layer 75 can be improved, compared with a case wherein a feedthrough portion is provided for the portion of the insulating layer 75 opposite the first feedthrough portion 72 (a case wherein a feedthrough portion is formed instead of the recessed portion 94). Therefore, the second electronic components 23 and 24 can be accurately mounted on second electronic component mounting pads 85, 101, 102, 105, 106, 111 and 112, provided on the upper face 75A of the insulating layer 75, which will be described later. The insulating layer 75 can be a resin layer made, for example, of an epoxy resin or a polyimide resin.

The vias 76 are formed in and pass through the portions of the insulating layer 75 covering the wires 74, to which the lower ends of the vias 76 are connected.

The wiring pattern 81 is formed on the portion of the upper face 75A of the insulating layer 75 that corresponds to the peripheral portion of the second circuit board 17, and is connected to the upper end of a via 76. The wiring pattern 81 includes: the second electronic component mounting pads 101 and 102, on which second electronic components 24 are mounted; and a wire 103, which electrically connects the second electronic mounting pads 101 and 102.

The wiring pattern 82 is formed on the portion of the upper face 75A of the insulating layer 75 that corresponds to the center portion of the second circuit board 17, and is connected to the upper end of a via 76. The wiring pattern 82 includes: the second electronic component mounting pad 105, on which a second electronic component 24 is mounted; the second electronic component mounting pad 106, on which the second electronic component 23 is mounted; and a wire 107, which electrically connects the second electronic component mounting pads 105 and 106.

The wiring pattern 83 is formed on the portion of the upper face 75A of the insulating layer 75 that corresponds to the peripheral portion of the second circuit board 17, and is connected to the upper end of a via 76. The wiring pattern 83 includes: the second electronic component mounting pad 111, on which the second electronic component 23 is mounted; the second electronic component mounting pad 112, on which a second electronic component 24 is mounted; and a wire 113, which electrically connects the second electronic component mounting pads 111 and 112.

The second electronic component mounting pads 85 are arranged on the portions of the upper face 75A of the insulating layer 75 that correspond to the peripheral portion of the second circuit board 17. The second electronic component mounting pads 85 are used for mounting second electronic components 24.

The wiring patterns 87 are formed on the portion of the upper face 75A of the insulating layer 75 that corresponds to the area where the recessed portion 94 is formed. The wiring patterns 87 are electrically connected to the second electronic component 23 and/or to the second electronic components 24.

As described above, since the wiring patterns 87 are formed in the portion of the upper face 75A of the insulating layer 75 that corresponds to the area where the recessed portion 94 (a recessed portion provided for accommodating portions of the first electronic components 13), the packaging density of the semiconductor apparatus 10 can be increased. As another method, instead of the recessed portion 94, a feedthrough portion may be formed that passes through the second circuit board 17 (specifically, the core board 71 and the insulating layers 75 and 93 in this embodiment). However, in this case, the wiring patterns 87 can not be formed above the first electronic components 13, and the packaging density can not be increased.

The vias 76, the wiring patterns 81 to 83, the second electronic component mounting pads 85 and the wiring patterns 87 can be formed at the same time, using Cu, for example, and by employing the semi-additive method.

The wires 91 are formed on a lower face 71B of the core board 71, and are connected to the lower ends of the feedthrough electrodes 73. The wires 91 can be formed using Cu, for example, and by employing the subtractive method.

The insulating layer 93, deposited on the lower face 71B of the core hoard 71 to cover the wires 91, includes a second feedthrough portion 114, which is one of the components of the recessed portion 94 and passes through the insulating layer 93 that corresponds to the area where the recessed portion 94 is formed. The insulating layer 93 can be a resin layer made, for example, of an epoxy resin or a polyimide resin.

The recessed portion 94 is formed in the portion of the second circuit board 17 opposite the first electronic components 13, part of the multiple first electronic components 12 and 13 mounted on the first circuit board 11, whose height is greater than that H3 of each of the internal connection terminals 19 positioned between the first circuit board 11 and the second circuit board 17. The recessed portion 94 includes the second feedthrough portion 114, which is formed in the insulating layer 93, and the first feedthrough portion 72, which passes through the core board 71, and is employed for accommodating portions of the first electronic components 13 that are mounted on the first circuit board 11.

As described above, the recessed portion 94, for accommodating portions of the first electronic components 13, is formed in the part of the second circuit board 17 opposite the first electronic components 13, two of the multiple first electronic components 12 and 13 mounted on the first circuit board 11, whose common height is greater than that $H_3$ of each of the internal connection terminals 19 located between the first circuit board 11 and the second circuit board 17. Therefore, the space thus provided between the first circuit board 11 and the second circuit board 17, on which the internal connection terminals 19 are positioned (specifically, the distance from the internal connection terminal pads 45, 54 and 66 to the internal connection terminal pads 97), is smaller than that which is provided conventionally, so that the height of the semiconductor 10 can be reduced.

Furthermore, when the space available between the first circuit board 11 and the second circuit board 17 at the portion where the internal connection terminal 19 is formed is smaller, the diameter of the internal connection terminals 19 arranged therein can be reduced to less than that (e.g., 0.5 mm) of the internal connection terminals 405 (see FIG. 1) provided for the conventional semiconductor apparatus 400. Therefore, the sizes, across the surface planes, of the connection terminal pads 45, 54 and 66, provided for the first circuit board 11, and of the internal connection terminal pads 97, provided for the second circuit board 17, can be reduced, i.e., the dimensions of the internal connection terminal pads 45, 54, 66 and 97 can be reduced. Accordingly, the sizes of the first and second circuit boards 11 and 17 can be reduced in the direction of their surface planes, and the semiconductor apparatus 10 can be longitudinally downsized.

Further, since the recessed portion 94 for accommodating the portions of the first electronic components 13 is formed only in the second circuit board 17, opposite the first electronic components 13, the height of which is greater than the height $H_3$ of the internal connection terminals 19, the size of the recessed portion 94 formed in the second circuit board 17 should be as small as the circumstances permit. In this way, excessive deterioration of the strength of the second circuit board 17, due to the formation of the recessed portion 94, can be prevented.

Instead of forming the recessed portion 94 in the second circuit board 17 as described in the foregoing, a recessed portion may be formed that passes through the insulating layer 93 and the core board 71 opposite the first electrode components 12 and 13 that are mounted on the first circuit board 11. In this case also, the semiconductor apparatus 10 can be downsized by reducing its height and its length, as measured along the plane of its upper surface.

The vias 95 are formed in and pass through portions of the insulating layer 93 below the wires 91, to which the upper ends of the vias 95 are connected.

The internal connection terminal pads 97 are arranged at multiple locations along a lower face 93A of the insulating layer 93, and are connected to the lower ends of the vias 95. The internal connection terminal pads 97 are used for mounting the internal connection terminals 19, and are electrically connected, via the internal connection terminals 19, either to one of the internal connection terminal pads 45, or to the internal connection terminal pad 54 or 66, all of which are provided for the first circuit board 11. The internal connection terminal pads 97, as formed, are smaller across their surface planes (are dimensionally smaller) than the internal connection terminal pads 435, 446, 458 and 485 (see FIG. 1) that are provided for the conventional semiconductor apparatus 400. When the diameter of the internal connection terminals 19 is 0.26 mm and the shape of the internal connection terminal pads 97 is substantially a circle in plan view, the diameter of the internal connection terminal pads 97 can, for example, be 200 μm.

The vias 95 and the internal connection terminal pads 97 described above can be formed at the same time using Cu, for example, and by employing the semi-additive method.

The internal connection terminals 19 are located between the first circuit board 11 and the second circuit board 17, and are connected either to one of the internal connection terminal pads 45 or to the internal connection terminal pad 54 or 66, all of which are provided for the first circuit board 11, and to the internal connection terminal pads 97 provided for the second circuit board 17. Thus, the internal connection terminals 19 electrically connect the first circuit board 11 to the second circuit board 17. The internal connection terminals 19 can, for example, be conductive balls, which include cores 115 and their covering coat portions 116, that maintain a predetermined distance between the first circuit board 11 and the second circuit board 17.

As described above, conductive balls are employed as the internal connection terminals 19, for which the cores 115 are provided, that are used to maintain the predetermined distance between the first circuit board 11 and the second circuit board 17. Therefore, even when an external force is applied to the semiconductor apparatus 10, the predetermined distance between the first circuit board 11 and the second circuit board 17 can be maintained. Furthermore, the internal connection terminals 19 also serve as spacers that enable the accurate, near parallel provision of the second circuit board 17 on the first circuit board 11.

The cores 115 can, for example, be metal balls (e.g., Cu balls) or resin balls. Example materials for resin balls can be polystyrene, polyacrylic ester and polyvinyl chloride, and the material for the coat portions 116 can, for example, be a solder. The diameter of the internal connection terminal 19 can, for example, be 0.26 mm, and in this case, the diameter of the cores 115 can, for example, be 0.20 mm. Further, when the diameter of the internal connection terminals 19 is 0.26 mm and the diameter of the cores 115 is 0.20 mm, the height $H_3$ of the internal connection terminals 19, positioned between the internal connection pads 45, 54 and 66 and the internal connection terminal pads 97, can, for example, be 200 μm.

The sealing resin 21 fills the space (including that within the recessed portion 94), defined by the first circuit board 11 and the second circuit board 17, in which the internal connection terminals 19 and the first electronic components 12 and 13 are located, i.e., the sealing resin 21 is used to enclose the internal connection terminals 19 and the first electronic components 12 and 13 arranged between the first circuit board 11 and the second circuit board 17. The sealing resin 21 can, for example, be an epoxy resin.

According to this arrangement, since the sealing resin 21 is provided to fill the space between the first circuit board 11 and the second circuit board 17, wherein the internal connection terminals 19 and the first electrode components 12 and 13 are arranged, damage to the internal connection terminals 19 and the first electronic components 12 and 13 can be prevented. Furthermore, the strength of the semiconductor apparatus 10 can be increased.

The sealing resin 21 is provided after the connection by means of the internal connection terminals has been completed between the first circuit board 11, on which the first electronic components 12 and 13 are mounted, and the second circuit board 17, on which the second electronic components 23 and 24 have not yet been mounted.

The second electronic component 23 is mounted on the second electronic component mounting pads 106 and 111 arranged on the second circuit board 17. A semiconductor chip, for example, can be employed as the second electronic component 23, and in this case, an underfilling resin may be provided between the second electronic component 23 and the second circuit board 17.

The second electronic components 24 are mounted on the second electronic component mounting pads 85, 101, 102, 105 and 112 arranged on the second circuit board 17. Chip capacitors, chip resistors or chip inductors can be employed as the second electronic components 24. The process for mounting second electronic components 23 and 24 on the second circuit board 17 is performed after the sealing resin 21 has been provided.

According to this arrangement, since the second electronic component mounting pads 85, 101, 102, 105, 106, 111 and 112 are mounted on the upper face 75A of the insulating layer 75 of the second circuit board 17 (the face of the second circuit board 17 opposite the face where the recessed portion 94 is formed), and since the second electronic components 23 and 24 are mounted on the second electronic component mounting pads 85, 101, 102, 105, 106, 111 and 112, the packaging density of the semiconductor apparatus 10 can be increased.

The semiconductor apparatus 10 having this arrangement can be manufactured using the well known method, except that the second circuit board 17 is formed using the core board 71 having the first feedthrough portion 72 and the insulating layer 93 having the second feedthrough portion 114. The first and second feedthrough portions 72 and 114, respectively, can be formed, for example, using a router.

According to the semiconductor apparatus 10 of this embodiment, the recessed portion 94, for accommodating portions of the first electronic components 13, is formed in the part of the second circuit board 17 opposite the first electronic components 13, two of the multiple first electronic components 12 and 13 mounted on the first circuit board 11, whose common height is greater than that $H_3$ of each of the internal connection terminals 19 located between the first circuit board 11 and the second circuit board 17. Therefore, the space thus provided between the first circuit board 11 and the second circuit board 17, on which the internal connection terminals 19 are positioned (specifically, the distance from the internal connection terminal pads 45, 54 and 66 to the internal connection terminal pads 97), is smaller than that which is provided conventionally, so that the height of the semiconductor 10 can be reduced.

Furthermore, when the space available between the first circuit board 11 and the second circuit board 17 at the portion where the internal connection terminal 19 is formed is smaller, the diameter of the internal connection terminals 19 arranged therein can be reduced to less than that (e.g., 0.5 mm) of the internal connection terminals 405 (see FIG. 1) provided for the conventional semiconductor apparatus 400. Therefore, the sizes, across the surface planes, of the connection terminal pads 45, 54 and 66, provided for the first circuit board 11, and of the internal connection terminal pads 97, provided for the second circuit board 17, can be reduced, i.e., the dimensions of the internal connection terminal pads 45, 54, 66 and 97 can be reduced. Accordingly, the sizes of the first and second circuit boards 11 and 17 can be reduced in the direction of their surface planes, and the semiconductor apparatus 10 can be longitudinally downsized.

In this embodiment, the description has been given by employing a case wherein the recessed portion 94 is defined using the second feedthrough portion 114, formed in the insulating layer 93, and the first feedthrough portion 72, which passes through the core board 71. However, the recessed portion 94 may be defined using the second feedthrough portion 114, formed in the insulating layer 93, and an opening that does not pass through the core board 71.

Figure 3:
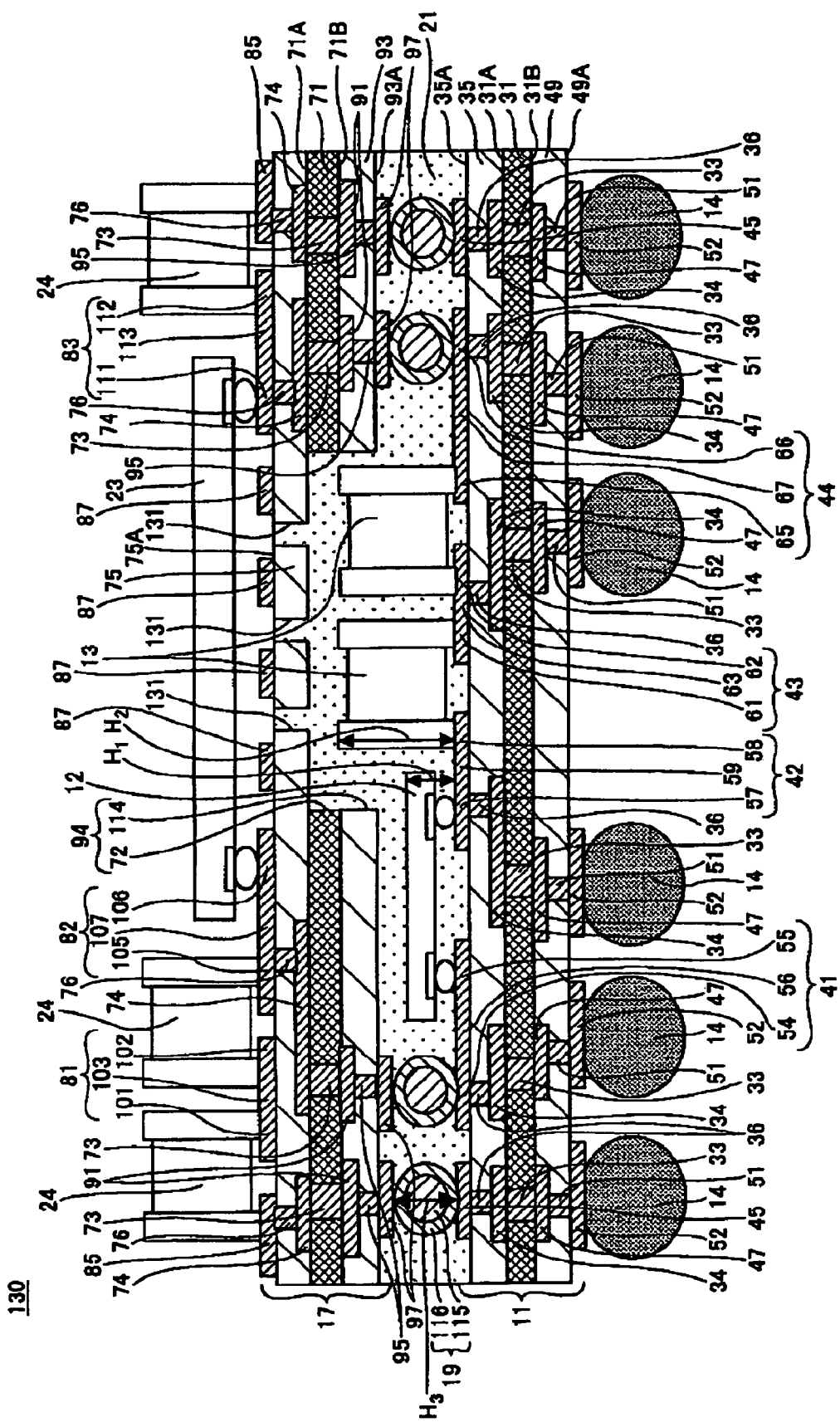
FIG. 3 is a cross-sectional view of a semiconductor apparatus according to a first modification of the first embodiment of the present invention.

FIG. 3 is a cross-sectional view of a first modification of the semiconductor apparatus of the first embodiment of the invention. In FIG. 3, the same reference numerals as used in the first embodiment are provided for components that correspond to those of the semiconductor apparatus 10 of the first embodiment.

While referring to FIG. 3, a semiconductor apparatus 130, for the first modification of the first embodiment, has the same arrangement as the semiconductor apparatus 10, except that third feedthrough portions 131 are formed in the insulating layer 75 of the semiconductor apparatus 10 of the first embodiment. The third feedthrough portions 131 are formed as through holes in the insulating layer 75 at the portions corresponding to the bottom of the recessed portion 94. In this case, through holes, for example, can be used as the third feedthrough portions 131. When the through holes are used as the third feedthrough portions 131, the diameters of the through holes can, for example, be 500 μm.

Since the third feedthrough portions 131 are formed through the insulating layer 75 from the bottom of the recessed portion 94, during the process performed to inject the sealing resin 21 into the space (including that of the recessed portion 94) between the first circuit board 11 and the second circuit board 17, air between the first and second circuit boards 11 and 17 is discharged from the semiconductor apparatus 10 via the third feedthrough portions 131. Therefore, the space between the first circuit board 11 and the second circuit board 17 can be accurately filled with the sealing resin 21 (without the occurrence of a void).

According to the semiconductor apparatus of the first modification of the first embodiment, since the third feedthrough portions 131 passing through the insulating layer 75 at the portions corresponding to the bottom of the recessed portion 94, the space between the first circuit board 11 and the second circuit board 17 can be accurately filled with the sealing resin 21 (without the occurrence of a void).

The semiconductor apparatus 130 of the first modification of the first embodiment can provide the same effects as can the semiconductor apparatus 10 of the first embodiment. To explain further, the first modification has been described by employing a case wherein the recessed portion 94 is defined using the second feedthrough portion 114, formed in the insulating layer 93, and the first feedthrough portion 72 that passes through the core board 71. However, the recessed portion 94 may be defined using the second feedthrough portion 114, formed in the insulating layer 93, and an opening that does not pass through the core board 71. In this modification, through holes may be provided as in the first modification.

Figure 4:
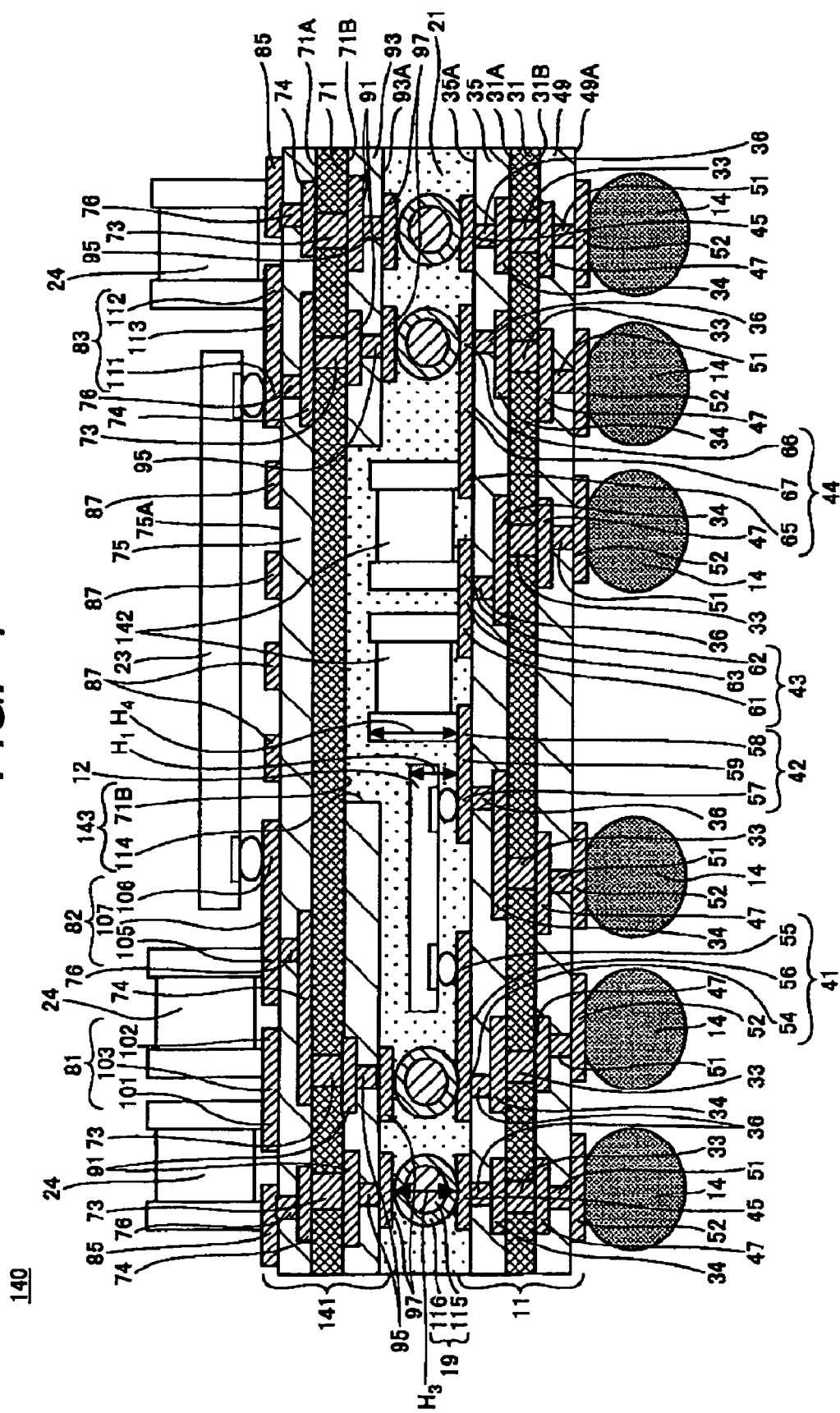
FIG. 4 is a cross-sectional view of a semiconductor apparatus according to a second modification of the first embodiment of the present invention.

According to this arrangement, the semiconductor apparatus 140 of the second modification of the first embodiment can provide the same effects as the semiconductor apparatus 10 of the first embodiment. Furthermore, in this embodiment, feedthrough portions FIG. 4 is a cross-sectional view of a semiconductor apparatus according to a second modification of the first embodiment of the invention. In FIG. 4, the same reference numerals used in the first embodiment are provided for components that correspond to those of the semiconductor apparatus 10 of the first embodiment.

While referring to FIG. 4, a semiconductor apparatus 140 of the second modification of the first embodiment has the same arrangement as the semiconductor apparatus 10 of the first embodiment, except that first electronic components 142 are employed that are lower in height than the first electronic components 13 that are mounted for the semiconductor apparatus 10, and in that a second circuit board 141 is employed instead of the second circuit board 17 used for the semiconductor apparatus 10.

The first electronic components 142 are mounted on the first electronic component mounting pads 58, 61, 62 and 65 arranged on the first circuit board 11. A height $H_4$ of the first electronic components 142 is less than the height $H_2$ of the first electronic components 13. The first electronic components 142 can, for example, be chip capacitors, chip resistors or chip inductors.

The second circuit board 141 is formed in the same manner as for the semiconductor apparatus 10, except that a recessed portion 143 is formed instead of the recessed portion 94 in FIG. 2, which is formed in the second circuit board 17.

The recessed portion 143 is defined by the second feedthrough portion 114, formed in the insulating layer 93, and a lower face 71B of the core board 71, which together correspond to the second feedthrough portion 114. That is, the first feedthrough portion 72 shown in FIG. 2 is not formed in the core board 71.

As described above, since the height $H_4$ of the first electronic component 142 is small, the recessed portion 143, for accommodating portions of the first electronic component 142, may be prepared by forming the second feedthrough portion 114 in only the insulating layer 93. With this arrangement, since the first feedthrough portion 72 is not formed in the core board 71, the strength of the second circuit board 141 will be greater than the strength of the second circuit board 17 in FIG. 2.

According to this arrangement, the semiconductor apparatus 140 of the second modification of the first embodiment can provide the same effects as the semiconductor apparatus 10 of the first embodiment. Furthermore, in this embodiment, feedthrough portions may be formed through the core board 71 and the insulating layer 75 from the bottom of the recessed portion 143, i.e., feedthrough portions may be formed that have the same function as the third feedthrough portions 131 shown in FIG. 3.

The second modification of this embodiment has been described by employing a case wherein the recessed portion 143 is defined by the second feedthrough portion 114, formed in the insulating layer 93, and the lower face 71B, of the core board 71, that together correspond to the second feedthrough portion 114. However, an opening in the insulating layer 93 may be formed that does not pass completely through, and this may be employed as the recessed portion 143.

(Second Embodiment)

Figure 5:
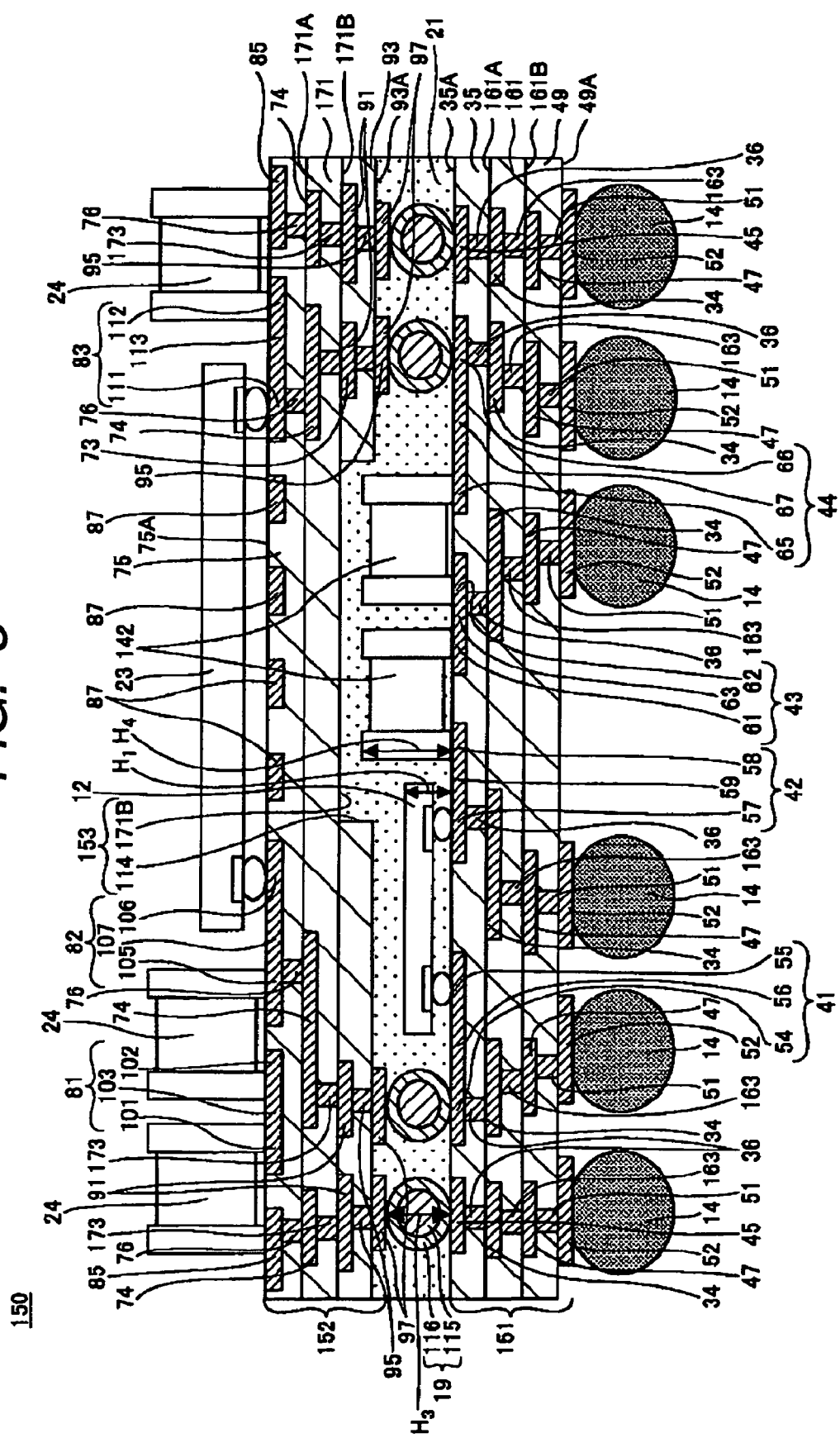
FIG. 5 is a cross-sectional view of a semiconductor apparatus according to a second embodiment of the present invention.

FIG. 5 is a cross-sectional view of a semiconductor apparatus according to a second embodiment of the present invention. In FIG. 5, the same reference numerals as in the first embodiment are provided for the components that correspond to those of the semiconductor apparatus 140 of the second modification of the first embodiment.

While referring to FIG. 5, a semiconductor apparatus 150 of the second embodiment has the same arrangement as the semiconductor apparatus 140 of the second modification of the first embodiment, except that first and second coreless circuit boards 151 and 152 are provided, instead of the first and second circuit boards 11 and 141, which are core build-up boards employed for the semiconductor apparatus 140.

The first circuit board 151 has the same structure as the first circuit board 11, except that an insulating layer 161 and vias 163 are provided, instead of the core board 31 and the feedthrough electrodes 33 provided for the first circuit board 11 shown in FIG. 4, and that the wires 34, the wiring patterns 41 to 44 and the internal connection terminal pads 45 are arranged at locations different from those used for the first circuit board 11.

The insulating layer 161 is located between the insulating layer 35 and the insulating layer 49, and a resin layer made, for example, of an epoxy resin or a polyimide resin, can be employed as the insulating layer 161. The wires 47 and the insulating layer 49 that covers the wires 47 are provided on a lower face 161B of the insulating layer 161.

The wiring pattern 34 is formed inside the insulating layer 161, so that the face of the wiring pattern 34, where the vias 36 are connected, can be substantially on the same plane as the upper face 161A of the insulating layer 161.

The vias 163 are formed through the portions of the insulating layer 161 located between the wires 34 and the wires 47, and connect the wires 34 and 47. That is, the vias 163, the wires 34 and the wires 47 are connected electrically.

The wiring patterns 41 and 44 and the internal connection terminal pads 45 are formed inside the insulating layer 35, so that the faces of the wiring patterns 41 to 44 and the internal connection terminal pads, on which the internal connection terminals 19 are mounted, can be substantially on the same plane as the upper face 35A of the insulating layer 35.

The second circuit board 152 is located above the first circuit board 151, so that the second circuit board 152 is opposite the face of the first circuit board 151 on which the first electronic components 12 and 142 are mounted. The second circuit board 152 is electrically connected to the first circuit board 151 via the internal connection terminals 19, which are located between the first and second circuit boards 151 and 152. The same arrangement as is used for the second circuit board 141 in FIG. 4 is employed for the second circuit board 152, except that an insulating layer 171 and vias 173 are formed, instead of the core board 71 and the feedthrough electrodes 73 provided for the second circuit board 141, that the wires 74, the wiring patterns 81 to 83 and 87 and the second electronic component mounting pads 85 are arranged at different locations from those employed for the second circuit board 141 and that a recessed portion 153 is additionally formed.

The insulating layer 171 is located between the insulating layer 75 and the insulating layer 93, and a resin layer made, for example, of an epoxy resin or a polyimide resin can be employed as the insulating layer 171. The insulating layer 93, which covers the wire 91 and which has a second feedthrough portion 114, is formed on a lower face 171B of the insulating layer 171.

The wiring pattern 74 is provided inside the insulating layer 171, so that the face of the wiring pattern 74 to which the vias 76 are connected can be substantially on the same plane as the upper face 171A of the insulating layer 171.

The vias 173 are formed in and pass through portions of the insulating layer 171 that are located between the wires 74 and 91, and electrically connect the wires 74 and 91.

The wiring patterns 81 to 83 and 87 and the second electronic component mounting pads 85 are arranged inside the insulating layer 75, so that the faces of the wiring patterns 81 to 83 and 87 and the second electronic component mounting pads 85, on which the second electronic components 23 and 24 are mounted, can be substantially on the same plane as the upper face 75A of the insulating layer 75. The wiring patterns 81 to 83 and 87 and the second electronic component mounting pads 85 can, for example, be an Ni/Au layered film, which is formed by layering an Ni film (e.g., having a thickness of 5.0 µm) and an Au layer (e.g., having a thickness of 0.5 µm), in the named order, inwardly under the upper face 75A of the insulating layer 75, an Ni/Pd/Au layered film, which is formed by layering an Ni layer, a Pd layer and an Au layer, in the named order, inwardly under the upper face 75A of the insulating layer 75, or a Pd/Au layered film, which is formed by layering a Pd layer and an Au layer, in the named order, inwardly under the upper face 75A of the insulating layer 75.

The recessed portion 153 is defined by the second feedthrough portion 114 formed in the insulating layer 93 and the lower face 171B of the insulating layer 171 (the face corresponding to the bottom of the recessed portion 153). The recessed portion 153 is used to accommodate portions of the first electronic components 142.

According to this embodiment, since coreless boards that are thinner than core build-up boards are employed as the first and second circuit boards 151 and 152 to constitute the semiconductor apparatus 150, the height of the semiconductor apparatus 150 can be reduced more.

With the above described arrangement, the semiconductor apparatus 150 of the second embodiment can provide the same effects as those provided by the semiconductor apparatus 10 of the first embodiment.

This embodiment has been described by employing a case wherein coreless boards are employed as the first and second circuit boards 151 and 152. However, one of the first and second circuit boards may be a coreless board, and the other circuit board may be a core build-up board. This arrangement can still provide the same effects as those provided by the semiconductor apparatus 10 of the first embodiment.

Furthermore, in the description of this embodiment, the recessed portion 153 has been defined using the second feedthrough portion 114 formed in the insulating layer 93 and the lower face 171B of the insulating layer 171 (the face corresponding to the bottom of the recessed portion 153). However, an opening that does not pass completely through the insulating layer 93 may be formed in the insulating layer 93 and may be employed as a recessed portion 153.

(Third Embodiment)

Figure 6:
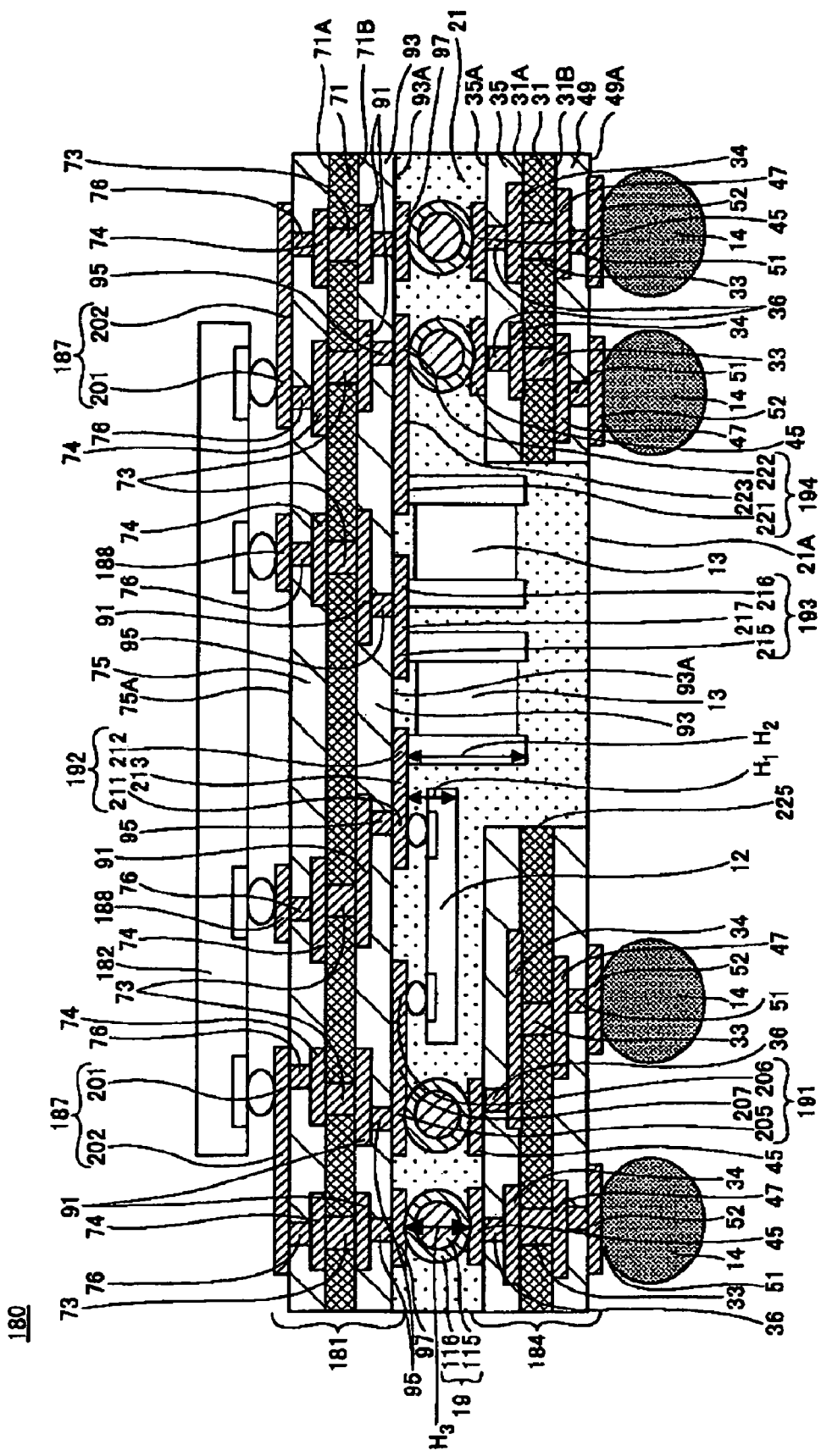
FIG. 6 is a cross-sectional view of a semiconductor apparatus according to a third embodiment of the present invention.

FIG. 6 is a cross-sectional view of a semiconductor apparatus according to a third embodiment of the present invention. In FIG. 6, the same reference numerals as are used in the second modification of the first embodiment are also provided for the components that correspond to those of the semiconductor apparatus 140 in the second modification of the first embodiment.

While referring to FIG. 6, a semiconductor apparatus 180 of the third embodiment includes: a first circuit board 181, first electronic components 12 and 13, a second electronic component 182, a second circuit board 184, external connection terminals 14, internal connection terminals 19 and a sealing resin 21.

The first circuit board 181 has the same arrangement as the second circuit board 141 shown in FIG. 4 (one of the components of the semiconductor apparatus 140 in FIG. 4), except that the recessed portion 143 is not required, that a wiring pattern 187 and second electronic component mounting pads 188 are provided, instead of the wiring patterns 81 to 83 and the second electronic component mounting pads 85 provided for the second circuit board 141, and that wiring patterns 191 to 194 are additionally formed.

The wiring pattern 187 is located on the portion of an upper face 75A of an insulating layer 75 that corresponds to the peripheral portion of the first circuit board 181, and is connected to the upper ends of vias 76. The wiring pattern 187 includes: second electronic component mounting pads 201, on which the second electronic component 182 is mounted; and wires 202, which are integrally formed with the second electronic component mounting pads 201, and are connected to the vias 76. The wiring pattern 187 can be formed at the same time as the vias 76, using Cu, for example, and by employing the semi-additive method.

The second electronic component mounting pads 188 are located in the portion of the upper face 75A of the insulating layer 75 corresponding to the center portion of the first circuit board 181, and are connected to the upper ends of the vias 76. With this arrangement, the second electronic components 182 are mounted on the second electronic component mounting pads 188. The second electronic component mounting pads 188 can be formed at the same time as the vias 76, using Cu, for example, and by employing the semi-additive method.

The wiring pattern 191 is arranged on a portion of a lower face 93A of an insulating layer 93 that corresponds to the peripheral portion of the first circuit board 181 and that is connected to the lower end of the via 95. The wiring pattern 191 includes: an internal connection terminal pad 205, on which the internal connection terminal 19 is arranged; a first electronic component mounting pad 206, on which the first electronic component 12 is mounted; and a wire 207, which electrically connects the internal connection terminal pad 205 to the first electronic component mounting pad 206.

The internal connection terminal pad 205 is formed so it is smaller across the plane of its surface (i.e., is smaller dimensionally) than the internal connection terminal pads 435, 446, 458 and 485 (see FIG. 1) that are provided for the conventional semiconductor apparatus 400. When the diameter of an internal connection terminal 19 is 0.26 mm and the shape of the internal connection terminal pad 205 is substantially a circle in plan view, the diameter of the internal connection terminal pad 205 can, for example, be 200 μm.

The wiring pattern 192 is formed on the portion of the upper face 93A of the insulating layer 93 that corresponds to the center of the first circuit board 181, and is connected to the lower end of a via 95. The wiring pattern 192 includes: a first electronic component mounting pad 211, on which the first electronic component 12 is mounted; a first electronic component mounting pad 212, on which a first electronic component 13 is mounted; and a wire 213, which electrically connects the first electronic component mounting pads 211 and 212.

The wiring pattern 193 is formed on the portion of the lower face 93A of the insulating layer 93 that corresponds to the center portion of the first circuit board 181, and is connected to the lower end of a via 95. The wiring pattern 193 includes: first electronic component mounting pads 215 and 216, on which first electronic components 13 are mounted; and a wire 217, which electrically connects the first electronic component mounting pads 215 and 216.

The wiring pattern 194 is formed on the portion of the lower face 93A of the insulating layer 93 that corresponds to the peripheral portion of the first circuit board 181, and is connected to the lower end of a via 95. The wiring pattern 194 includes: a first electronic component mounting pad 221, on which a first electronic component 13 is mounted; an internal connection terminal pad 222, to which the internal connection terminal 19 is connected; and a wire 223, which electrically connects the first electronic component mounting pad 221 to the internal connection terminal pad 222.

The internal connection terminal pad 222 is formed so it is smaller (i.e., is smaller dimensionally) across the plane of its surface than are the internal connection terminal pads 435, 446, 458 and 485 (see FIG. 1) that are provided for the conventional semiconductor apparatus 400. When the diameter of the internal connection terminal 19 is 0.26 mm and the shape of the internal connection terminal pad 222 is substantially a circle in plan view, the diameter of the internal connection terminal pad 222 can, for example, be 200 μm.

The wiring patterns 191 to 194 that have the above structure can be formed at the same time as the vias 95, using Cu, for example, and by employing the semi-additive method.

The first electronic component 12 is mounted on the first electronic component mounting pads 206 and 211 provided on the lower face of the first circuit board 181 (the face opposite the second circuit board 184).

The first electronic component 13 is mounted on the first electronic component mounting pads 212, 215, 216 and 221 that are arranged on the lower face of the first circuit board 181. In this case, of multiple first electronic components 12 and 13 mounted on the first circuit board 181, the first electronic components 13 are those that have a height that rises above the lower ends of the internal connection terminals 19 connected to the first circuit board 181.

The second electronic component 182 is mounted on the second electronic component mounting pads 188 and 201 arranged on the upper face of the first circuit board 181.

The second circuit board 184 is located below the first circuit board 181, opposite the first electronic components 12 and 13 that are mounted on the first circuit board 181. And the second circuit board 184 is electrically connected to the first circuit board 181 via the internal connection terminals 19 provided between the first and second circuit boards 181 and 184.

The second circuit board 184 has the same structure as the first circuit board 11 in FIG. 4 (one of the components of the semiconductor apparatus 140 in FIG. 4), except that the wiring patterns 41 to 44 are not required and an electronic component accommodating feedthrough portion 225 is formed to accommodate portions of the first electronic components 13.

The electronic component accommodating feedthrough portion 225 is formed through the portion of the core board 31 and the insulating layers 35 and 49 that is opposite the first electronic components 13, which have a height that rises above the lower ends of the internal connection terminals 19 connected to the first circuit board 181.

According to this arrangement, since the electronic component accommodating feedthrough portion 225 for accommodating the portions of the first electronic components 13 is formed in the part of the second circuit board 184 opposite the first electronic components 13, which are mounted on the first circuit board 181 and have a height that rises above the lower end of the internal connection terminals 19 connected to the first circuit board 181, the distance between the first and the second circuit boards 181 and 184, where the distance between the internal connection terminals 19 (specifically, the distance between the internal connection terminal pads 45 and the internal connection terminal pads 97, 205 and 222) is smaller than the conventional distance. Therefore, the height of the semiconductor apparatus 180 can be reduced.

Furthermore, when the space available between the first circuit board 181 and the second circuit board 184 at the position where the internal connection terminal 19 is formed is smaller, the diameter of the internal connection terminals 19 arranged therein can be reduced to less than that (e.g., 0.5 mm) of the internal connection terminals 405 provided for the conventional semiconductor apparatus 400. Therefore, the sizes, across the surface planes, of the internal connection terminal pads 45, provided for the first circuit board 181, and of the internal connection terminal pads 97, 205 and 222, provided for the second circuit board 184, can be reduced, i.e., the dimensions of the internal connection terminal pads 45, 97, 205 and 222 can be reduced. Accordingly, the sizes of the first and second circuit boards 181 and 184 can be reduced in the direction of their surface planes, and the semiconductor apparatus 180 can be longitudinally downsized.

The external connection terminals 14 are mounted on external connection pads 52 that are arranged on the second circuit board 184. The internal connection terminals 19 are provided to connect the internal connection terminal pads 45, provided for the second circuit board 184, to either the internal connection terminal pads 97, 205 or 222 provided for the first circuit board 181.

A sealing resin 21 is used to fill the space between the first circuit board 181 and the second circuit board 184 and the space in the electronic component accommodating feedthrough portion 225. Therefore, the sealing resin 21 encloses the first electronic components 12 and 13 and the internal connection terminals 19 that are located between the first and second circuit boards 181 and 184. A lower face 21A of the sealing resin 21, which defines the electronic component accommodating feedthrough portion 225, is substantially on the same plane as a lower face 49A of the insulating layer 49.

According to the semiconductor apparatus 180 of the third embodiment, the electronic component accommodating feedthrough portion 225, for accommodating portions of the first electronic components 13, is formed in the part of the second circuit board 184 opposite the first electronic components 13, which are mounted on the first circuit board 181 and have a height that rises above the lower end of the internal connection terminals 19 that are connected to the first circuit board 181. Therefore, the distance between the first and second circuit boards 181 and 184 where the internal connection terminals 19 are arranged (specifically, the distance between the internal connection terminal pads 45 and the internal connection terminal pads 97, 205 and 222), can be smaller than the conventional distance. Thus, the height of the semiconductor apparatus 180 can be reduced.

Furthermore, when the space available between the first circuit board 181 and the second circuit board 184 at the position where the internal connection terminal 19 is formed is smaller, the diameter of the internal connection terminals 19 arranged therein can be reduced to less than that (e.g., 0.5 mm) of the internal connection terminals 405 provided for the conventional semiconductor apparatus 400. Therefore, the sizes, across the surface planes, of the internal connection terminal pads 45, provided for the second circuit board 184, and of the internal connection terminal pads 97, 205 and 222, provided for the first circuit board 181, can be reduced, i.e., the dimensions of the internal connection terminal pads 45, 97, 205 and 222 can be reduced. Accordingly, the sizes of the first and second circuit boards 181 and 184 can be reduced in the direction of their surface planes, and the semiconductor apparatus 180 can be longitudinally downsized.

This embodiment has been described by employing a case wherein core build-up boards are employed as the first and second circuit boards 181 and 184; however, coreless boards (circuit boards shown in FIG. 5) that do not have a core board may be employed as the first and second circuit boards 181 and 184. In this case, the effects obtained using the semiconductor apparatus 180 of this embodiment can still be obtained.

Furthermore, in the description given for this embodiment, the first electronic component 12 has been mounted on the first circuit board 181. However, the first electronic component 12 may be mounted on the second circuit board 184 (specifically, on the portion of the second circuit board 184 opposite the first circuit board 181).

The preferred embodiments of the present invention have been described in detail. However, the present invention is not limited to these specific embodiments, and can be variously modified or changed within the scope of the subject of the invention.

The present invention can be applied for a semiconductor apparatus wherein electronic components are arranged between two built-up circuit boards.

What is claimed is:

1. A semiconductor apparatus comprising:
first electronic components;
a first circuit board including first electronic component mounting pads on which the first electronic components are mounted;
a second circuit board located above the first circuit board; and
a sealing resin provided to seal a space between the first circuit board and the second circuit board, wherein
the first electronic component mounting pads are arranged on a first face of the first circuit board, opposite the second circuit board,
the first circuit board and the second circuit board are electrically connected by internal connection terminals located therebetween, and
a recessed portion is formed in the second circuit board opposite the first electronic components to accommodate portions of the first electronic components.

2. The semiconductor apparatus according to claim 1, wherein the first electronic components are mounted on the first circuit board at multiple locations, and the recessed portion is formed in a portion of the second circuit board, opposite part of the first electronic components mounted on the first circuit board, which is higher than a height of the internal connection terminals located between the first circuit board and the second circuit board.

3. The semiconductor apparatus according to claim 1, wherein a feedthrough portion is formed in the second circuit board and passes through a portion of the second circuit board that corresponds to a bottom of the recessed portion.

4. The semiconductor apparatus according to claim 1, wherein second electronic component mounting pads are arranged on a face of the second circuit board, opposite a face where the recessed portion is formed, and a second electronic component is mounted on the second electronic mounting pad.

5. The semiconductor apparatus according to claim 1, wherein the internal connection terminal is a conductive ball comprising:
a core for maintaining a predetermined distance between the first circuit board and the second circuit board, and
a coat portion that covers the core.

6. The semiconductor apparatus according to claim 1, further comprising:
external connection pads which are arranged on a second face of the first circuit board opposite the first face and are electrically connected to the second circuit board.

7. A semiconductor apparatus comprising:
first electronic components;
a first circuit board including first electronic component mounting pads on which the first electronic components are mounted;
a second circuit board, located below the first circuit board, that faces the first electronic components mounted on the first circuit board, the second circuit board having external connection terminals provided on a first surface of the second circuit board, wherein the first surface is opposite to a second surface of the second circuit board facing the first circuit board; and
a sealing resin provided to seal a space between the first circuit board and the second circuit board, wherein
the first circuit board and the second circuit board are electrically connected by internal connection terminals located therebetween, and
an electronic component accommodating feedthrough portion, for accommodating portions of the first electronic components, is formed in the second circuit board and passes through a portion of the second circuit board that faces the first electronic components.

8. The semiconductor apparatus according to claim 7, wherein the first electronic components are mounted at multiple locations, and the electronic component accommodating feedthrough portion is formed in a portion of the second circuit board, opposite part of the first electronic components mounted on the first circuit board, that rises above lower ends of the internal connection terminals connected to the first circuit board.

9. The semiconductor apparatus according to claim 7, wherein second electronic component mounting pads are arranged on a face of the first circuit board, opposite a face where the first electronic component mounting pads are formed, and a second electronic component is mounted on the second electronic mounting pad.

10. The semiconductor apparatus according to claim 7, wherein the internal connection terminal is a conductive ball comprising:
   a core for maintaining a predetermined distance between the first circuit board and the second circuit board, and
   a coat portion that covers the core.

* * * * *